(12) United States Patent
Hsiung et al.

(10) Patent No.: US 9,972,678 B2
(45) Date of Patent: May 15, 2018

(54) SEMICONDUCTOR DEVICE AND METHOD OF FORMING THE SAME

(71) Applicant: United Microelectronics Corp., Hsinchu (TW)

(72) Inventors: Chang-Po Hsiung, Hsinchu (TW); Ping-Hung Chiang, Hsinchu (TW); Shih-Chieh Pu, New Taipei (TW); Chia-Lin Wang, Yunlin County (TW); Nien-Chung Li, Hsinchu (TW); Wen-Fang Lee, Hsinchu (TW); Shih-Yin Hsiao, Chiayi County (TW); Chih-Chung Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/287,535

(22) Filed: Oct. 6, 2016

(65) Prior Publication Data

US 2018/0102408 A1    Apr. 12, 2018

(51) Int. Cl.
| | |
|---|---|
| *H01L 27/088* | (2006.01) |
| *H01L 29/06* | (2006.01) |
| *H01L 29/51* | (2006.01) |
| *H01L 21/762* | (2006.01) |
| *H01L 21/311* | (2006.01) |

(52) U.S. Cl.
CPC .... *H01L 29/0649* (2013.01); *H01L 21/31111* (2013.01); *H01L 21/7621* (2013.01); *H01L 27/088* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 7,094,653 B2 | 8/2006 | Chang et al. | |
| 2011/0260294 A1* | 10/2011 | Oh | H01L 21/76229 257/607 |
| 2012/0034783 A1 | 2/2012 | Entalai et al. | |
| 2014/0353740 A1* | 12/2014 | Nishida | H01L 21/82381 257/326 |
| 2016/0126091 A1* | 5/2016 | Guo | H01L 21/02334 438/703 |

\* cited by examiner

*Primary Examiner* — Calvin Choi
(74) *Attorney, Agent, or Firm* — J.C. Patents

(57) ABSTRACT

A method of forming a semiconductor device is provided including the following steps. A substrate having a first voltage area and a second voltage area is provided. A first oxide layer is formed in the first voltage area. The first oxide layer is removed to form a recess in the first voltage area. A shallow trench isolation (STI) structure is formed in the substrate, wherein a first portion of the STI structure is located in the first voltage area and a second portion of the STI structure is located in the second voltage area, a top surface of the STI structure is higher than the top surface of the substrate, and a bottom surface of the first portion of the STI structure in the first voltage area is lower than a bottom surface of the second portion of the STI structure in the second voltage area.

17 Claims, 6 Drawing Sheets

SEMICONDUCTOR DEVICE AND METHOD OF FORMING THE SAME

BACKGROUND OF THE INVENTION

1. Field of the Invention

The present invention generally relates to a semiconductor device, in particular, to a semiconductor device having different voltage areas, and a method of forming the same.

2. Description of Related Art

For MOS structures having metal gate, high K materials are commonly used as the gate oxide material for increasing gate capacitance. During the processing of such MOS structure, a thicker gate oxide is generally observed in higher voltage areas. Due to the thicker gate oxide layers, a gate height in the high voltage area is also higher than a gate height in the low voltage area. As such, the gate height in the higher voltage area may be lost during a subsequent chemical-mechanical planarization (CMP) process. Furthermore, a height difference may also be observed in the shallow trench isolation (STI) structure, and it is possible that during the formation of the gate structure, polysilicon residues may remain in lower height areas of the STI structure. As a result, the height differences observed in the gate and STI structures may cause problems such as device mismatch and reduced performance. Based on the above, there is a need to provide a method that minimize the height differences while still maintaining the variation in the gate oxide thickness in different voltage areas.

SUMMARY OF THE INVENTION

Accordingly, the present invention is directed to a semiconductor device and a method of forming the same, whereby the gate height differences is minimized and the variation in the gate oxide thickness is maintained in different voltage areas.

The invention provides a method of forming a semiconductor device including the following steps. A substrate having a first voltage area and a second voltage area is provided. A first oxide layer is formed in the first voltage area, wherein the first oxide layer grows up and down from a top surface of the substrate in the first voltage area. The first oxide layer is removed to form a recess in the first voltage area. A shallow trench isolation (STI) structure is formed in the substrate, wherein a first portion of the STI structure is located in the first voltage area and a second portion of the STI structure is located in the second voltage area, a top surface of the STI structure is higher than the top surface of the substrate, and a bottom surface of the first portion of the STI structure in the first voltage area is lower than a bottom surface of the second portion of the STI structure in the second voltage area.

In an embodiment of the invention, prior to the formation of the first oxide layer, a first mask layer is formed on the substrate in the second voltage area, and a thermal oxidation process is used to form the first oxide layer in the first voltage area.

In an embodiment of the invention, prior to the formation of the STI structure, a second mask layer is formed on the substrate in parts of the first voltage area and the second voltage area, and the substrate not protected by the second mask layer is etched to form a trench such that the STI structure is formed within the trench.

In an embodiment of the invention, after the formation of the STI structure, the following steps are performed. The first portion of the STI structure in the first voltage area is partially removed. A second oxide layer is formed on the first voltage area while a third oxide layer is formed on the second voltage area, wherein the second oxide layer grows up and down from the top surface of the substrate in the first voltage area, and the third oxide layer grows up and down from the top surface of the substrate in the second voltage area. The third oxide layer is removed and the second portion of the STI structure located in the second voltage area is partially removed, such that the top surface of the STI structure, the top surface of the second oxide layer and the top surface of the substrate in the second voltage area are substantially coplanar to generate a coplanar surface.

In an embodiment of the invention, a bottom surface of the second oxide layer is located below the coplanar surface.

In an embodiment of the invention, after the formation of the STI structure and prior to the partial removal of the first portion of the STI structure in the first voltage area, the second portion of the STI structure in the second voltage area is covered with a third mask layer, and the first portion of the STI structure in the first voltage area is partially removed by wet etching.

In an embodiment of the invention, prior to the removal of the third oxide layer and the partial removal of the second portion of the STI structure, the second oxide layer and the first portion of the STI structure in the first voltage area is covered with a fourth mask layer, and the removal of the third oxide layer and the partial removal of the second portion of the STI structure is then performed by wet etching.

In an embodiment of the invention, the recess has a recess depth H1, and a step height difference H2 exist between the bottom surface of the first portion of the STI structure in the first voltage area and the bottom surface of the second portion of the STI structure in the second voltage area, wherein H1=H2.

In an embodiment of the invention, the operating voltage of the first voltage area is from 6V to 8V.

In an embodiment of the invention, the operating voltage of the second voltage area is from 0.9V to 1V.

The invention further provides a semiconductor device including a substrate, a shallow trench isolation (STI) structure. The substrate has a first voltage area and a second voltage area. The STI structure is located in the substrate, wherein a first portion of the STI structure is located in the first voltage area, a second portion of the STI structure is located in the second voltage area and a bottom surface of the first portion of the STI structure in the first voltage area is lower than a bottom surface of the second portion of the STI structure in the second voltage area.

In an embodiment of the invention, the semiconductor device further comprises a first gate oxide layer, a second gate oxide layer and a first gate structure. The first gate oxide layer is located on the substrate in the first voltage area, wherein a top surface of the STI structure, a top surface of the first gate oxide layer and a top surface of the substrate in the second voltage area are substantially coplanar to generate a coplanar surface. The second gate oxide layer is located on the first gate oxide layer. The first gate structure is located on the second gate oxide layer in the first voltage area.

In an embodiment of the invention, the semiconductor device further comprises a second gate oxide layer and a second gate structure. The second gate oxide layer is located on the substrate in the second voltage area. The second gate structure is located on the second gate oxide layer in the second voltage area.

In an embodiment of the invention, a bottom surface of the first gate oxide layer is located below the coplanar surface.

In an embodiment of the invention, the operating voltage of the first voltage area is from 6V to 8V.

In an embodiment of the invention, the operating voltage of the second voltage area is from 0.9V to 1V.

In an embodiment of the invention, a material of the second gate oxide layer is $HfO_2$.

Based on the above, by forming a recess in the first voltage area, the gate height differences between different voltage areas can be appropriately tuned in the subsequent processes, such that the top surface of the STI structure, the top surface of the second oxide layer and the top surface of the substrate in the second voltage area are substantially coplanar, and the gate structures formed thereon will have approximately the same height. As such, the problem of device mismatch and reduced performance can be resolved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
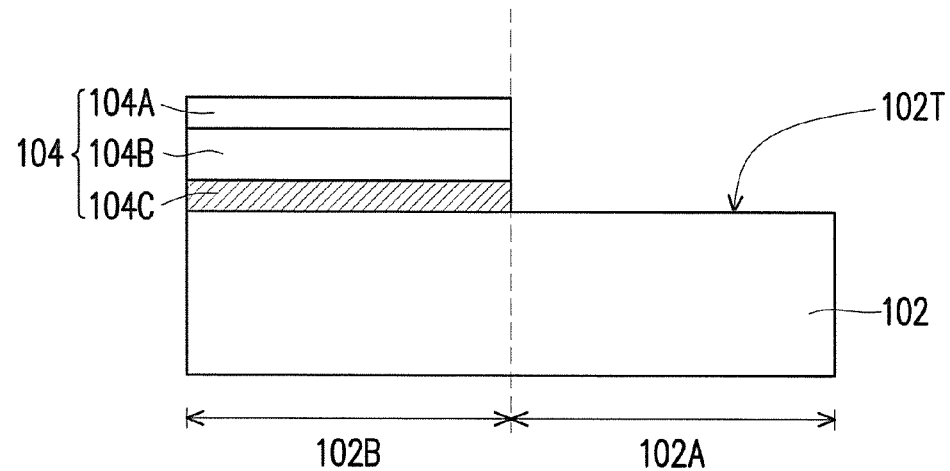
FIG. 1A to FIG. 1K is the process flow of forming a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1K is the process flow of forming a semiconductor device according to an embodiment of the invention. Referring to FIG. 1A, a substrate 102 having a first voltage area 102A and a second voltage area 102B is provided. In an embodiment of the invention, the substrate 102 is a silicon substrate suitable for forming devices with different voltages thereon. For example, devices having a lower operating voltage, such as 0.9V or 1V may be formed on one side of the silicon substrate 102, while devices having higher operating voltage, such as 6V or 8V may be formed on another side of the silicon substrate 102. In the present embodiment, the operating voltage of the first voltage area 102A may be from 6V to 8V. On the other hand, the operating voltage of the second voltage area 102B may be from 0.9V to 1V.

As shown in FIG. 1A, a first mask layer 104 is formed on the substrate 102 in the second voltage area 102B. In an embodiment of the invention, the first mask layer 104 consist of a photoresist layer 104A, a hard mask layer 104B and a buffer layer 104C stacked sequentially on the substrate 102. In the present embodiment, the hard mask layer 104B is a silicon nitride hard mask layer, while the buffer layer 104C is an oxide layer which serve as the buffer layer of the silicon nitride hard mask layer. The first mask layer 104 only covers the second voltage area 102B, while the first voltage area 102A is exposed.

Figure 1B:
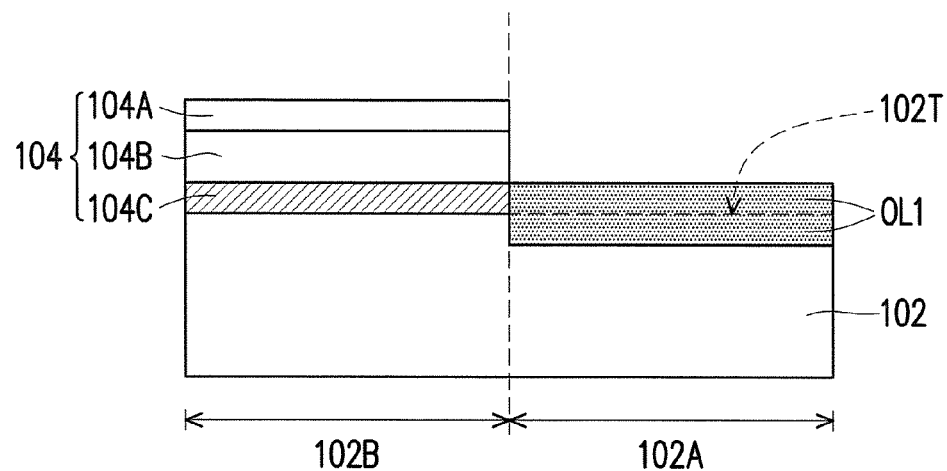

In a subsequent step as shown in FIG. 1B, a first oxide layer OL1 is formed in the first voltage area 102A, wherein the first oxide layer OL1 grows up and down from a top surface 102T of the substrate 102 in the first voltage area 102A. In the present embodiment, a thermal oxidation process is used to form the first oxide layer OL1 in the first voltage area 102A. The thickness of the first oxide layer OL1 may be appropriately controlled and selected as the thickness of the first oxide layer OL1 directly affects the depth of a recess formed in the first voltage area 102A in a subsequent step.

Figure 1C:
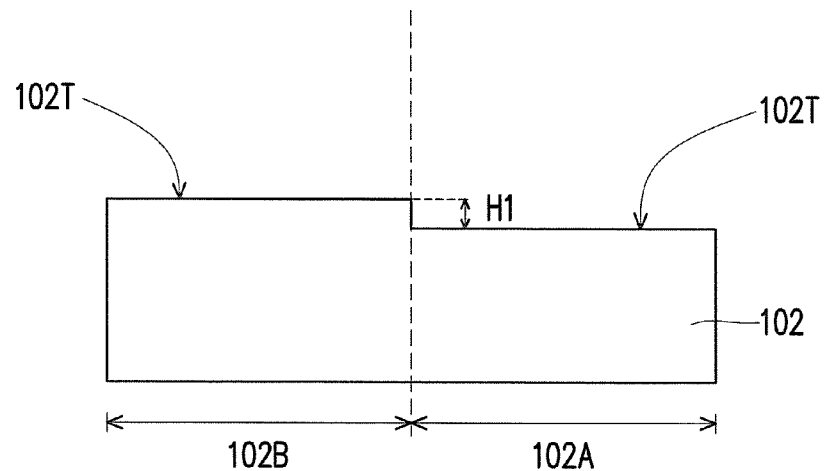

Next, as shown in FIG. 1C, the first oxide layer OL1 is removed to form a recess in the first voltage area 102A, wherein the recess has a recess depth H1. In the present embodiment, the first oxide layer OL1 is completely removed by wet etching, and the first mask layer 104 covering the second voltage area 102B is removed thereafter. As such, a step height difference is generated between the first voltage area 102A and the second voltage area 102B, wherein the step height difference corresponds to the recess depth H1. As mentioned above, the recess depth H1 is directly affected by the thickness of the first oxide layer OL1. More specifically, the thickness of the first oxide layer OL1 that grows below the top surface 102T of the substrate 102 will correspond to the recess depth H1. That is, if a greater recess depth H1 is desired, then a thicker oxide layer OL1 that grows up and down from the top surface 102T of the substrate 102 will be required.

Figure 1D:
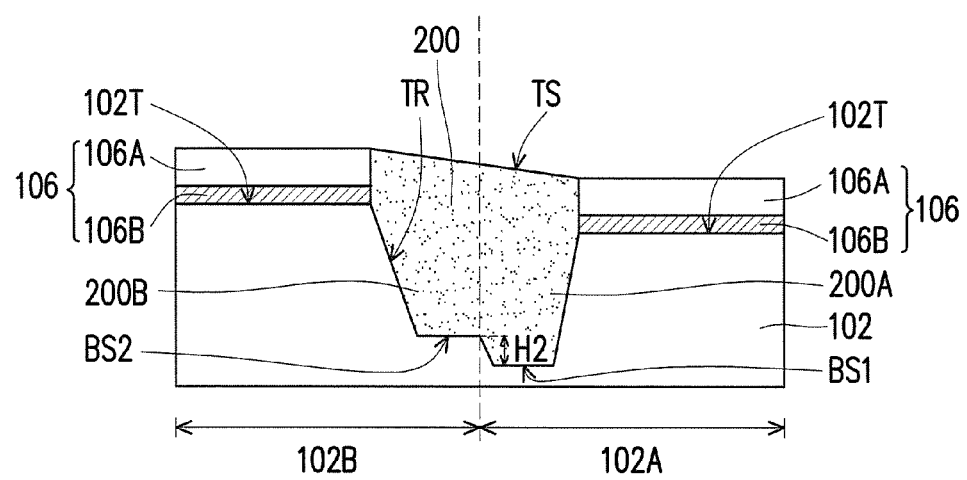

After formation of the recess, a shallow trench isolation (STI) structure 200 is formed in the substrate 102 as shown in FIG. 1D. Specifically, prior to the formation of the STI structure 200, a second mask layer 106 is formed on the substrate 102 in parts of the first voltage area 102A and the second voltage area 102B, while other parts of the of the first voltage area 102A and the second voltage area 102B are exposed for forming the STI structure 200. The second mask layer 106 consists of a hard mask layer 106A and a buffer layer 106B stacked sequentially on the substrate 102. The hard mask layer 104B is a silicon nitride hard mask layer, while the buffer layer 104C is an oxide layer which serves as the buffer layer of the silicon nitride hard mask layer. In the present embodiment, the substrate 102 not protected by the second mask layer 106 is etched to form a trench TR. The trench TR is formed to have a step height difference H2 at the bottom surface of the trench. More specifically, the step height H2 is generated due to the presence of the recess depth H1 in the substrate 102. That is, the step height difference H2 and the recess depth H1 will correspondingly have the same height.

Thereafter, an isolation material, such as silicon oxide material, is filled into the trench TR to form the STI structure 200. Excess isolation material may be removed by using the chemical-mechanical planarization (CMP) process until the top surface of the second mask layer 106 is exposed.

As shown in FIG. 1D, for the formed STI structure 200, a first portion 200A of the STI structure 200 is located in the first voltage area 102A and a second portion 200B of the STI structure 200 is located in the second voltage area 102B. Furthermore, a top surface TS of the STI structure 200 is higher than the top surface 102T of the substrate. In addition, due to the presence of the step height difference H2 formed at the bottom surface of the trench TR, the STI structure 200 located within the trench TR will have a structure where a bottom surface BS1 of the first portion 200A of the STI structure 200 in the first voltage area 102A is lower than a bottom surface BS2 of the second portion 200B of the STI structure 200 in the second voltage area 102B. That is, in the present embodiment, the recess has a recess depth H1, and a step height difference H2 exist between the bottom surface BS1 of the first portion 200A of the STI structure 200 in the first voltage area 102A and the bottom surface BS2 of the second portion 200B of the STI structure 200 in the second voltage area 102B, wherein H1=H2.

Figure 1E:
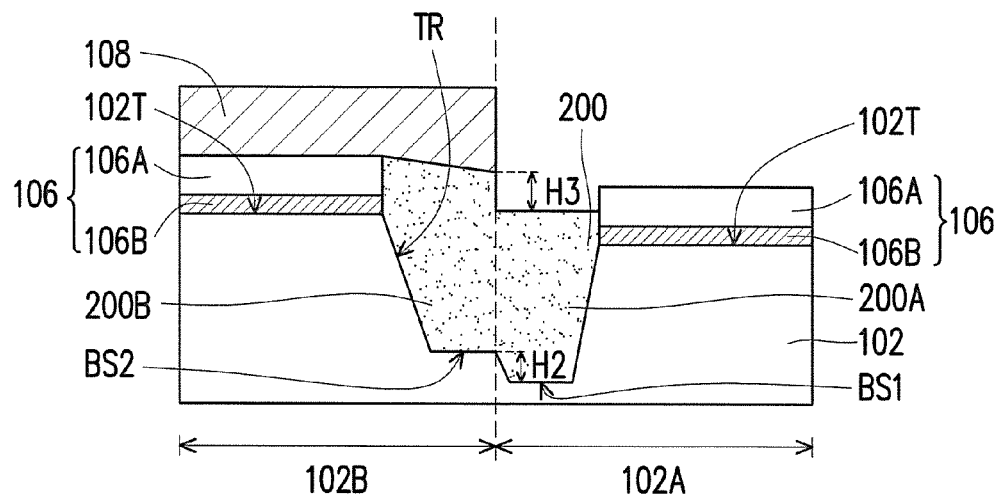

Next, as shown in FIG. 1E, the first portion 200A of the STI structure 200 in the first voltage area 102A is partially removed so as to generate a height difference H3 at the top of the STI structure 200. More specifically, prior to the partial removal of the first portion 200A of the STI structure 200 in the first voltage area 102A, the second portion 200B of the STI structure 200 in the second voltage area 102B is covered with a third mask layer 108, such as a photoresist layer. Thereafter, the first portion 200A of the STI structure 200 in the first voltage area 102A is partially removed by wet etching so as to generate the height difference H3.

Figure 1F:
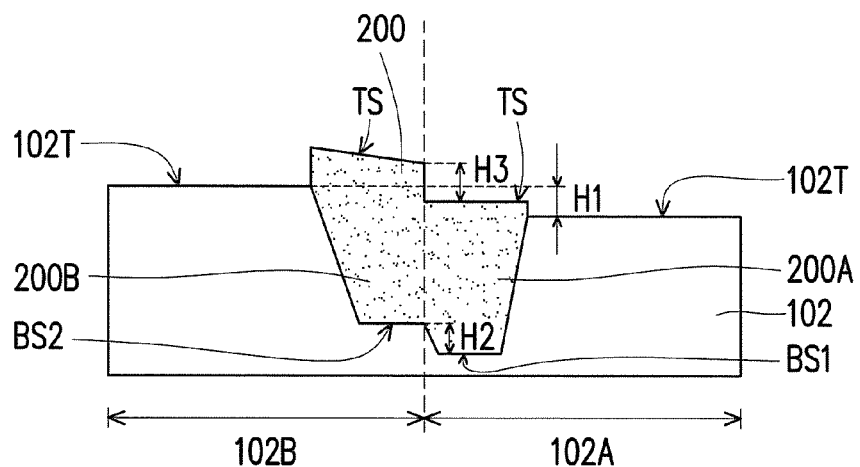

Next, as shown in FIG. 1F, the third mask layer 108 and the hard mask layer 106A are first removed. In the present embodiment, the remaining buffer layer 106B and the STI structure 200 is made of oxides, therefore, they can be etched off at the same time. More specifically, an etching back process is performed to completely remove the buffer layer 106B, while a height of the STI structure 200 is further reduced during etching. As such, a height difference between the top surfaces TS of the STI structure 200 and the top surfaces 102T of the substrate 102 is reduced and controlled.

Overall, a height difference (recess depth H1) can be observed between the top surfaces 102T of the first voltage area 102A and the second voltage area 102B, while a height difference H3 can be observed between the top surfaces TS of the first portion 200A and the second portion 200B of the STI structure 200. Furthermore, the height of the STI structure 200 is controlled during etching such that it still protrudes out from the top surfaces 102T of the substrate 102.

Figure 1G:
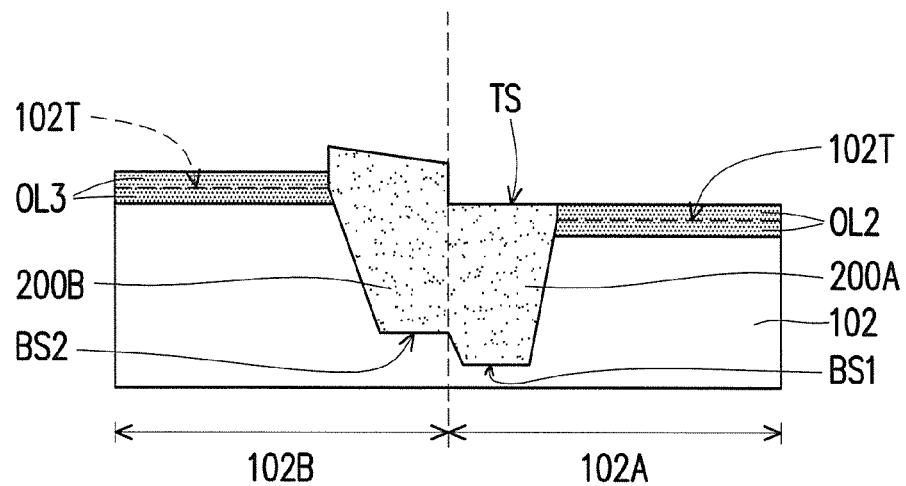

In the step shown in FIG. 1G, a second oxide layer OL2 is formed in the first voltage 102A while a third oxide layer OL3 is formed in the second voltage area 102B. In the present embodiment, the second oxide layer OL2 grows up and down from the top surface 102T of the substrate 102 in the first voltage area 102A, and the third oxide layer OL3 grows up and down from the top surface 102T of the substrate 102 in the second voltage area 102B. More specifically, the second oxide layer OL2 that grows up from the top surface 102T of the substrate 102 will become coplanar with the top surface TS of the first portion 200A of the STI structure 200. Furthermore, the third oxide layer OL3 that grows below the top surface 102T of the substrate 102 will become coplanar with the top surface TS of the first portion 200A.

To achieve such coplanar structure, the recess depth H1, the height difference H3 and the etching back process of the STI structure 200 shown in FIG. 1F may be appropriately tuned and calculated such that the second oxide layer OL2 will grow until it matches the height of the first portion 200A of the STI structure 200 in the first voltage area 102A.

Figure 1H:
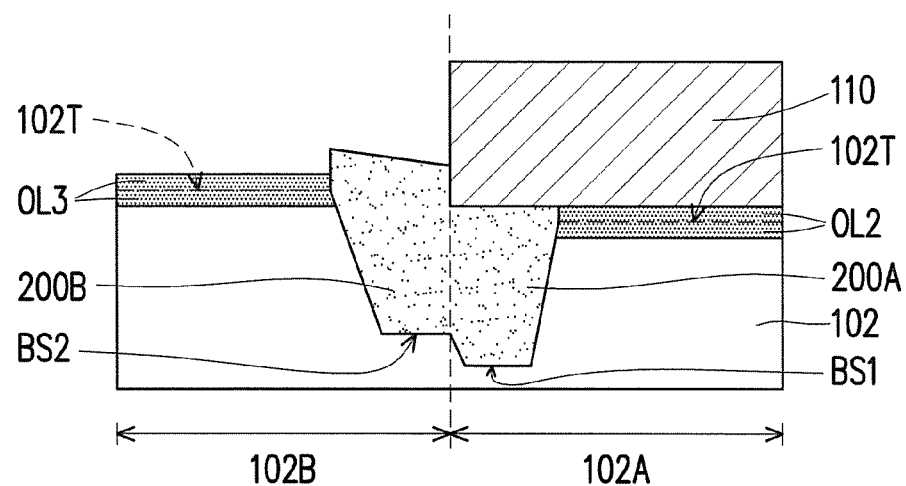
Figure 1I:
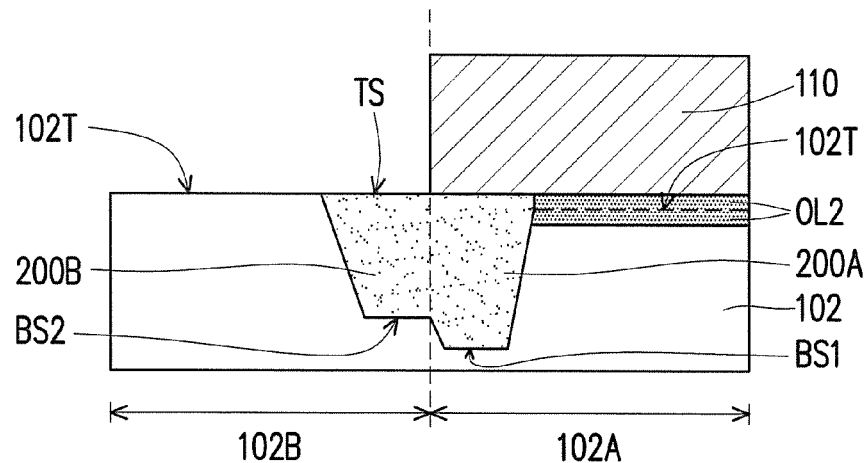

Next, in the step shown in FIG. 1H, the second oxide layer OL2 and the first portion 200A of the STI structure 200 in the first voltage area 102A are covered with a fourth mask layer 110. The fourth mask layer 110 only covers the first voltage area 102A, whereas the third oxide layer OL3 and the second portion 200B of the STI structure 200 are exposed.

Subsequently, as shown in step II, the removal of the third oxide layer OL3 and the partial removal of the second portion 200B of the STI structure 200 is then performed by wet etching. In the present embodiment, after removal of the third oxide layer OL3 and the partial removal of the second portion 200B of the STI structure 200, the top surface 102T of the substrate 102 and the top surface TS of the second portion 200B of the STI structure 200 in the second voltage area 102b will become coplanar. More specifically, prior to etching, although the third oxide layer OL3 and the second portion 200B of the STI structure 200 are not at equal height, the two layers may be etched to become coplanar. That is, etching is performed to completely remove the third oxide layer OL3, while the second portion 200B of the STI structure 200 maybe continuously etched until it becomes coplanar with the top surface 102T of the substrate 102.

Figure 1J:
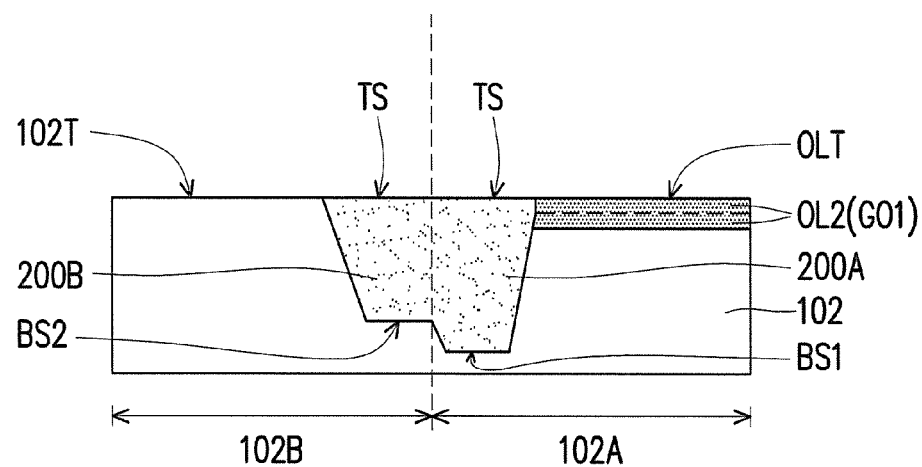

Next, as shown in FIG. 1J, upon completion of the wet etching step, the fourth mask layer 110 will be removed to expose the surfaces of the substrate 102, the STI structure 200 and the second oxide layer OL2. At this point, it is possible to confirm that the top surface 102T of the substrate 102 in the second voltage area 102B is coplanar with the top surface OLT of the second oxide layer OL2. In addition, it is also possible to confirm that the top surface TS of the first portion 200A of the STI structure 200 is coplanar with the top surface TS of the second portion 200B of the STI structure 200. As such, the top surface TS of the STI structure 200, the top surface OLT of the second oxide layer OL2 and the top surface 102T of the substrate 102 in the second voltage area 102B are substantially coplanar to generate a coplanar surface (102T/TS/OLT being coplanar).

In the present embodiment, the second oxide layer OL2 may be treated as a first gate oxide layer GO1 of the first voltage area 102A. The purpose of having the first gate oxide layer GO1 is so that it compensates for the thicker gate oxide layer required in the first voltage area 102A. In addition, a bottom surface of the second oxide layer OL2 (or the first gate oxide layer GO1) is located below the coplanar surface. That is, the second oxide layer OL2 (or the first gate oxide layer GO1) may be considered as being embedded inside the substrate 102 and below the coplanar surface.

Figure 1K:
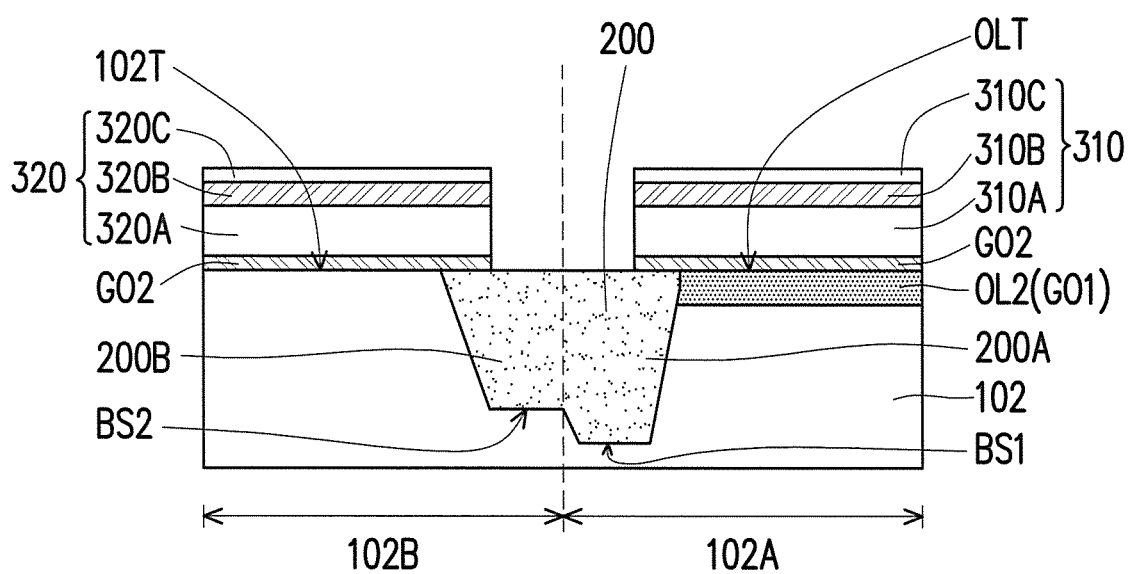

Finally, as shown in FIG. 1K, a semiconductor device may be achieved by further disposing a second gate oxide layer GO2, a first gate structure 310 and a second gate structure 320 thereon. In the present embodiment, the first gate structure 310 consist of a polysilicon layer 310A and a hard mask layer made of an oxide layer 310B and a nitride layer 310C. Similarly, the second gate structure 320 consist of a polysilicon layer 320A and a hard mask layer made of an oxide layer 320B and a nitride layer 320C. Furthermore, in the present embodiment, a material of the second gate oxide layer GO2 is $HfO_2$, which is a high-K dielectric material. However, the material of the gate oxide layers is not particularly limited thereto, and any other suitable gate oxide materials may be selected.

As shown in the steps above, the first gate oxide layer GO1 is pre-formed and located on the substrate 102 in the first voltage area 102A. The second gate oxide layer GO2 is then formed on the substrate 102 in the second voltage area 102B and on the first gate oxide layer GO1 in the first voltage area 102A. As such, the first gate structure 310 may be formed on the second gate oxide layer GO2 in the first voltage area 102A, and the second gate structure 320 may be formed on the second gate oxide layer GO2 in the second voltage area 102B. Since the top surface TS of the STI structure 200, the top surface OLT of the second oxide layer OL2 and the top surface 102T of the substrate 102 in the second voltage area 102B are substantially coplanar, the first gate structure 310 and the second gate structure 320 disposed thereon can be controlled to have the same gate height. As such, the problem of device mismatch and reduced performance can be resolved.

Accordingly, by forming a recess in the first voltage area having a recess depth H1 and forming a STI structure to generate a height difference H3, and controlling the etching back process of the STI structure, the gate height differences between different voltage areas can be appropriately tuned in the subsequent processes. Therefore, the top surface of the STI structure, the top surface of the second oxide layer and the top surface of the substrate in the second voltage area are substantially coplanar to generate a coplanar surface, and the gate structures formed thereon will have approximately the same height. As such, the semiconductor device of the invention can have better performance, and the problem of device mismatch can be resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
    a substrate (102), having a first voltage area (102A) and a second voltage area (102B);
    a shallow trench isolation (STI) structure (200) located in the substrate (102), wherein a first portion (200A) of the STI structure (200) is located in the first voltage area (102A), a second portion (200B) of the STI structure (200) is located in the second voltage area (102B) and a bottom surface (BS1) of the first portion (200A) of the STI structure (200) in the first voltage area (102A) is lower than a bottom surface (BS2) of the second portion (200B) of the STI structure (200) in the second voltage area (102B);
    a first gate oxide layer (GO1) located on the substrate (102) in the first voltage area (102A), wherein a top surface (TS) of the STI structure (200), a top surface (OLT) of the first gate oxide layer (GO1) and a top surface (102T) of the substrate (102) in the second voltage area (102B) are substantially coplanar to generate a coplanar surface (102T/TS/OLT);
    a second gate oxide layer (GO2) located on the first gate oxide layer (GO1); and
    a first gate structure (310) located on the second gate oxide layer (GO2) in the first voltage area (102A).

2. The semiconductor device according to claim 1, wherein the second gate oxide layer (GO2) is located on the substrate (102) in the second voltage area (102B), and the semiconductor device further comprises:
    a second gate structure (320) located on the second gate oxide layer (GO2) in the second voltage area (102B).

3. The semiconductor device according to claim 1, wherein a bottom surface of the first gate oxide layer (GO1) is located below the coplanar surface (102T/TS/OLT).

4. The semiconductor device according to claim 1, wherein an operating voltage of the first voltage area (102A) is from 6V to 8V.

5. The semiconductor device according to claim 1, wherein an operating voltage of the second voltage area (102B) is from 0.9V to 1V.

6. The semiconductor device according to claim 1, wherein a material of the second gate oxide layer (GO2) is HfO$_2$.

7. The semiconductor device according to claim 2, wherein a material of the second gate oxide layer (GO2) is HfO$_2$.

8. A method of forming a semiconductor device, comprising:
    providing a substrate (102) having a first voltage area (102A) and a second voltage area (102B);
    forming a first oxide layer (OL1) in the first voltage area (102A), wherein the first oxide layer (OL1) grows up and down from a top surface (102T) of the substrate (102) in the first voltage area (102A), and is not formed in the second voltage area (102B);
    removing the first oxide layer (OL1) to form a recess (H1) in the first voltage area (102A); and
    forming a shallow trench isolation (STI) structure (200) in the substrate (102), wherein a first portion (200A) of the STI structure (200) is located in the first voltage area (102A) and a second portion (200B) of the STI structure (200) is located in the second voltage area (102B), a top surface (TS) of the STI structure (200) is higher than the top surface (102T) of the substrate (102), and a bottom surface (BS1) of the first portion (200A) of the STI structure (200) in the first voltage area (102A) is lower than a bottom surface (BS2) of the second portion (200B) of the STI structure (200) in the second voltage area (102B).

9. The method of forming the semiconductor device according to claim 8, wherein prior to forming the first oxide layer (OL1), a first mask layer (104) is formed on the substrate (102) in the second voltage area (102B), and a thermal oxidation process is used to form the first oxide layer (OL1) in the first voltage area (102A).

10. The method of forming the semiconductor device according to claim 9, wherein prior to forming the STI structure (200), a second mask layer (106) is formed on the substrate (102) in parts of the first voltage area (102A) and the second voltage area (102B), and the substrate (102) not protected by the second mask layer (106) is etched to form a trench (TR) such that the STI structure (200) is formed within the trench (TR).

11. The method of forming the semiconductor device according to claim 8, wherein after forming the STI structure (200), further comprises the steps of:
    partially removing the first portion (200A) of the STI structure (200) in the first voltage area (102A);
    forming a second oxide layer (OL2) on the first voltage area (102A) and forming a third oxide layer (OL3) on the second voltage area (102B), wherein the second oxide layer (OL2) grows up and down from the top surface (102T) of the substrate (102) in the first voltage area (102A), and the third oxide layer (OL3) grows up and down from the top surface (102T) of the substrate (102) in the second voltage area (102B); and
    removing the third oxide layer (OL3) and partially removing the second portion (200B) of the STI structure (200) located in the second voltage area (102B), such that the top surface (TS) of the STI structure (200), the top surface (OLT) of the second oxide layer (OL2) and the top surface (102T) of the substrate (102) in the second voltage area (102B) are substantially coplanar to generate a coplanar surface (102T/TS/OLT).

12. The method of forming the semiconductor device according to claim 11, wherein a bottom surface of the second oxide layer (OL2) is located below the coplanar surface (102T/TS/OLT).

13. The method of forming the semiconductor device according to claim 11, wherein after the formation of the STI structure (200) and prior to the partial removal of the first portion (200A) of the STI structure (200) in the first voltage area (102A), the second portion (200B) of the STI structure (200) in the second voltage area (102B) is covered with a third mask layer (108), and the first portion (200A) of the STI structure (200) in the first voltage area (102A) is partially removed by wet etching.

14. The method of forming the semiconductor device according to claim 13, wherein prior to the removal of the third oxide layer (OL3) and the partial removal of the second portion (200B) of the STI structure (200), the second oxide layer (OL2) and the first portion (200A) of the STI structure (200) in the first voltage area (102A) is covered with a fourth mask layer (110), and the removal of the third oxide layer (OL3) and the partial removal of the second portion (200B) of the STI structure (200) is then performed by wet etching.

15. The method of forming the semiconductor device according to claim 8, wherein the recess has a recess depth H1, and a step height difference H2 exist between the bottom surface (BS1) of the first portion (200A) of the STI structure (200) in the first voltage area (102A) and the bottom surface (BS2) of the second portion (200B) of the STI structure (200) in the second voltage area (102B), wherein H1=H2.

16. The method of forming the semiconductor device according to claim 8, wherein an operating voltage of the first voltage area (102A) is from 6V to 8V.

17. The method of forming the semiconductor device according to claim 8, wherein an operating voltage of the second voltage area (102B) is from 0.9V to 1V.

* * * * *